United States Patent

Ciszek

[11] B 4,000,030
[45] Dec. 28, 1976

[54] METHOD FOR DRAWING A MONOCRYSTAL FROM A MELT FORMED ABOUT A WETTABLE PROJECTION

[75] Inventor: Theodore F. Ciszek, Salt Point, N.Y.

[73] Assignee: International Business Machines Corporation, Armonk, N.Y.

[22] Filed: June 9, 1975

[21] Appl. No.: 584,997

[44] Published under the second Trial Voluntary Protest Program on March 9, 1976 as document No. B 584,997.

[52] U.S. Cl. .................. 156/608; 156/617 SP; 23/273 SP
[51] Int. Cl.² ................. C01B 33/02; B01J 17/18
[58] Field of Search ............... 156/608, 617; 23/273 SP, 301 SP

[56] References Cited

UNITED STATES PATENTS

| 3,002,824 | 10/1961 | Francois | 156/608 |
| 3,033,660 | 5/1962 | Okkerse | 156/617 |
| 3,077,384 | 2/1963 | Enk | 23/273 SP |
| 3,096,158 | 7/1963 | Gaule | 156/608 |
| 3,291,574 | 12/1966 | Pierson | 23/273 SP |
| 3,591,348 | 7/1971 | LaBelle | 156/608 |
| 3,650,703 | 3/1972 | LaBelle | 156/608 |
| 3,687,633 | 8/1972 | LaBelle | 23/273 SP |
| 3,701,636 | 10/1972 | LaBelle | 156/608 |
| 3,765,843 | 10/1973 | LaBelle | 23/273 SP |
| 3,853,489 | 12/1974 | Bailey | 23/301 SP |

Primary Examiner—Wilbur L. Bascomb, Jr.
Assistant Examiner—S. J. Emery
Attorney, Agent, or Firm—Henry Powers

[57] ABSTRACT

Growth of shaped crystals, such as silicon, germanium, garnet, sapphire and the like, using a crucible to contain a melt in conjunction with a wettable submerged projection extending above the level of the melt over which is formed a convex or raised meniscus of the melt by surface tension. A seed crystal is brought in contact with the meniscus and then drawn upwardly so that the melt of the meniscus crystallizes out and grows to the crystal lattice of the seed as a continuation thereof.

9 Claims, 5 Drawing Figures

U.S. Patent  Dec. 28, 1976  4,000,030
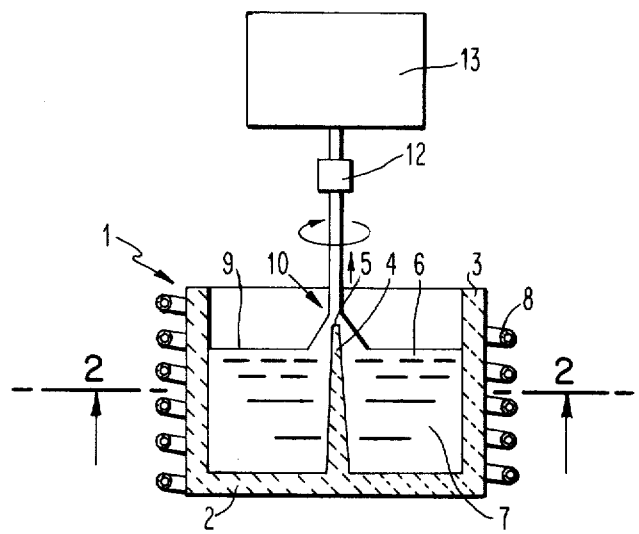
FIG. 1
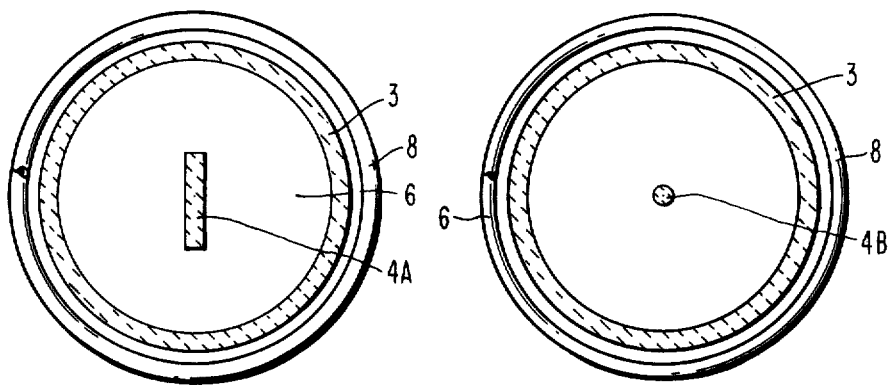
FIG. 2      FIG. 3
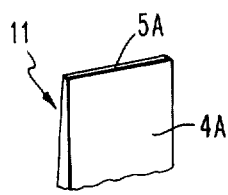      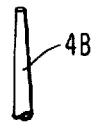
FIG. 2A      FIG. 3A

METHOD FOR DRAWING A MONOCRYSTAL FROM A MELT FORMED ABOUT A WETTABLE PROJECTION

FIELD OF THE INVENTION

This invention relates to the drawing of crystals from a melt, and more particularly to the drawing of elongated crystalline bodies from a melt from materials such as silicon, germanium, intermetallic compounds, sapphire, garnet, and the like.

DESCRIPTION OF THE PRIOR ART

In one known method, a melt, of a material to be drawn into an elongated crystal, is formed in a crucible, into which a seed crystal is brought in contact with the melt and then slowly drawn upwards to induce growth of the melt to the crystal lattice of seed by crystallization as melt rises with the seed.

An alternate method utilizes the concept of capillary action of the melt by drawing it upwardly between the walls of shaped openings of a die partially submerged in the melt. This method has the advantage of utilizing the die opening to control the cross-sectional configuration of the drawn crystal.

SUMMARY OF THE INVENTION

In its broad concept, this invention utilizes the surface tension of a melt to form a raised meniscus of the melt about a projection extending above the melt surface. The meniscus, of the melt, will conform to the cross-section of the projection to enable controlling the configuration of the drawn crystal. Accordingly, where the projection comprises an elongated wedge tapering to a vertex protruding slightly above the melt, the melt can be drawn in ribbon form. Conversely, where the projection has a conical configuration, the melt can be drawn in cylindrical or rod form.

The projection is comprised of any suitable material wettable by the melt (e.g. high density graphite or silicon carbide for silicon) having a meniscus shaping configuration with its vertex protruding slightly above the melt top level. A convex meniscus is formed as the melt wets up the sides of the projection and over the vertex thereof to form the desired meniscus shape. The projection, as indicated, can be tapered to a vertex of any desired thickness or point, which enables the drawing of crystals of very small cross-sectional dimensions.

The maximum extension of the meniscus shaping projection above the melt can be readily calculated in conformance with the relationship $$b \leq \sqrt{\frac{2F}{dg}}$$

where

"b" is the maximum extension of the projection above the melt (assuming perfect wetting, i.e. a contact angle of zero). For partially wetted projections, "b" will be correspondingly smaller.

"F" is the surface tension of the melt in dynes per centimeter where 1 dyne corresponding to the same value in gm cm/sec$^2$, "d" is the density of the melt in gms/cm$^3$, and "g" is the gravitational constant in cm/sec$^2$.

Typically, for the drawing of monocrystalline silicon members from a melt of silicon having a surface tension of 720 dynes/cm and a density of 2.56 gm/cm$^3$, the maximum protrusion of the projection (e.g. vertex) can be calculated accordingly:

$$b = \sqrt{\frac{2(720 \text{ gm cm/cm sec}^2)}{(2.56 \text{ gm/cm}^3)(981 \text{ cm/sec}^2)}}$$

$$b = \sqrt{.573 \text{ cm}^2} = .76 \text{ cm}$$

$$= 7.6 \text{ mm}$$

Thus, the vertex of the projection above the melt level can extend a distance up to 0.76 cm or 7.6 mm.

However, it is to be noted that it is sufficient for the melt to rise to top corners of a truncated projection, whereat a seed crystal can be touched to the top of a projection and then partially melted so that the melt will wet both the projection and the growing crystal.

After formation of the melt meniscus, about the extension of the projection above the melt, a seed crystal, of the melt material, is then brought in contact with the meniscus and then slowly drawn upwardly as the melt solidifies and crystallizes on the seed, in accordance with conventional techniques. The melt which is removed from the meniscus by solidification, on the growing crystal, is replenished by continuous wetting of the melt up the sides of the projection extending above the melt level. Also, any suitable means can be employed for maintaining a uniform melt level as it is depleted during crystal drawing, as for example the technique disclosed in U.S. Pat. No. 3,033,660 issued May 8, 1962 to B. Okkerse.

The foregoing provides a new technique for drawing crystals which can provide units of substantially smaller dimension and configuration heretofore possible by shaping of the vertex of the projection extending above the melt level. Thus, thinner ribbons of the drawn crystal become possible since a wedge can be employed for the projection and tapered to an infinitely small vertex or thickness. Likewise, extremely small diameter crystalline rods can be drawn using similar shaping of the taper of a conical projection.

The foregoing and other objects, features and advantages of the invention will be apparent from the following more particular description of the preferred embodiments of the invention as illustrated in the accompanying drawings.

BRIEF DESCRIPTION OF THE DRAWINGS

FIG. 1 is a schematic view in cross-section of one crucible unit comprehended to be in accordance with this invention.

FIG. 2 is a cross-sectional view along lines 2—2 of FIG. 1 illustrating one embodiment of a projection for forming a meniscus of the melt adapted to draw crystalline ribbons.

FIG. 2A is a partial view in perspective of the meniscus forming projection of FIG. 2.

FIG. 3 is a cross-sectional view along line 2—2 of FIG. 1 illustrating another embodiment of a projection for forming a meniscus of the melt adapted to draw crystalline rods.

FIG. 3A is a partial view in perspective of the meniscus forming projection of FIG. 3.

DESCRIPTION OF THE PREFERRED EMBODIMENTS

With reference to the drawings, FIG. 1 shows a crucible 1 having a bottom wall 2 and side walls 3. Extending upwardly from the inner surface of bottom wall 2, is a projection 4 tapered to vertex 5 at a height at which it will protrude above the top surface of a melt 6. It is to be understood that although the projection 4 is shown as an integral extension of bottom wall 2, it may also be a discrete member suitably secured in extension to crucible 1.

As indicated previously, the projection 4 is formed of any suitable material wettable by melt 6 so that the melt will wet up the sides of projection 4 by surface tension to form a convex or raised meniscus over the vertex 5. As for example for drawing monocrystalline silicon members, the projection 4 can be formed of high density graphite or silicon carbide. Similarly, for drawing garnet crystal, the projection 4 can be comprised of iridium, and for sapphire crystals the projection can be iridium or molybdenum.

The crucible is charged with the material to be drawn in crystal form, such as silicon, germanium, garnet, sapphire, intermetallic compounds, and the like. The melt 7 of the material is formed by means of a high frequency coil 8 which on energization produces heat in the side walls 3 of the crucible which is transferred to the charge so as to form a melt therefrom. However, as will be understood, any conventional means of heating can be employed, such as resistance heating. The quantity or position of the charge is controlled so that the melt surface 9 will be maintained at a level below the projection vertex 5 at the required distance conforming to the relationship indicated above. As discussed hereinbefore, this distance is controlled so that the surface tension of the melt causes it to wet up the sides of the projection 4 and over the vertex 5 to result in a convex or raised meniscus 10 from which a crystal member is drawn. As indicated previously, where the projection 4 is in the form of a wedge 4A as indicated in FIGS. 2 and 2A, the crystal can be drawn in ribbon form whose cross-section can be controlled by appropriate dimensioning of the wedge vertex 5A, as for example by truncating the top, as at 11, to a flat of the desired dimensions.

Conversely, where the projection 4 is in the form of a cone 4B, the crystal can be drawn in rod form whose diameter can similarly be controlled by appropriate dimensioning of the cone vertex, as by truncating. As will be understood, the projection can be formed of any desired configuration, e.g. pyramidical, in accordance with the cross-section of the crystal to be drawn, e.g. square. In general, any arbitrary cross-sectional shapes can be drawn by corresponding shaping of the projection.

The drawing of the crystal is effected by contacting of the convex melt meniscus 10 by means of a seed crystal supported in chuck 12 which is connected to any conventional pulling mechanism 13 for drawing the crystal from a melt as it grows and crystallizes on the seed which is slowly raised at controlled rates away from meniscus 10 required for crystal growth.

As will be understood, the crystal drawing unit can be disposed within any suitable enclosure (not shown) containing atmospheres normally employed for controlling the integrity of the drawn crystal.

Illustrative of the operation of the invention for drawing a monocrystalline silicon ribbon 5, a high density graphite wedge 4A was employed with a truncated vertex providing a flat 11 of 1mm by 6mm protruding 3mm above a silicon melt surface. A <110> silicon seed was used to initiate growth from the meniscus of the silicon melt formed over the wedge flat 11 followed by pulling at a growth rate of about 13mm/min.

The field of the induction coil 8 was controlled to maintain the meniscus melt at a temperature of approximately 1420°C. At these conditions, a ribbon of monocrystalline silicon was obtained with dimensions of 5mm wide and 2mm thick.

While the invention has been particularly shown and described with reference to preferred embodiments thereof and applications therefor, it will be understood by those skilled in the art that various changes in form and details may be made therein and the invention employed for various applications without departing from the spirit and scope of the invention.

What is claimed is:

1. A method of growing a monocrystalline material of controlled cross-section comprising:
    A. forming a melt of said material in a crucible about a submerged solid projection wettable about its entire surface by said melt with said projecting having its upper distal end extending above the surface of said melt a distance to form a raised meniscus of said melt thereon, and
    B. drawing a crystal of said melt away from said raised meniscus of said melt, while maintaining the level of said melt below the distal end of said projection said distance maintaining thereon said raised meniscus of said melt by surface tension in spaced relation to the side walls of said crucible.

2. The method of claim 1 wherein said melt comprises a semiconductor material.

3. The method of claim 2 wherein said material comprises silicon.

4. The method of claim 1 wherein said projection consisting of a thin wedge tapered to a vertex in said extension above said melt, said wedge having an elongated cross-section to define a ribbon of said crystal during said drawing operation.

5. The method of claim 4 wherein said melt comprises a semiconductor material.

6. The method of claim 5 wherein said material comprises silicon.

7. The method of claim 1 wherein said projection consists of a solid of conical configuration tapered to a vertex in said extension above said melt, to define a rod of said crystal during said drawing operation.

8. The method of claim 7 wherein said melt comprises a semiconductor material.

9. The method of claim 8 wherein said material comprises silicon.

* * * * *